(12) United States Patent
Murata et al.

(10) Patent No.: US 12,172,412 B2
(45) Date of Patent: Dec. 24, 2024

(54) COVER TAPE FOR PACKING ELECTRONIC COMPONENT, PACKAGE, AND PACKAGE SET

(71) Applicant: DAI NIPPON PRINTING CO., LTD., Tokyo-to (JP)

(72) Inventors: Ayuro Murata, Tokyo-to (JP); Satoshi Endo, Tokyo-to (JP); Takashi Mihara, Tokyo-to (JP); Nobuyuki Tominaga, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 240 days.

(21) Appl. No.: 17/767,238

(22) PCT Filed: Oct. 9, 2020

(86) PCT No.: PCT/JP2020/038305
§ 371 (c)(1),
(2) Date: Apr. 7, 2022

(87) PCT Pub. No.: WO2021/070936
PCT Pub. Date: Apr. 15, 2021

(65) Prior Publication Data
US 2022/0396057 A1 Dec. 15, 2022

(30) Foreign Application Priority Data
Oct. 11, 2019 (JP) .................. 2019-187868

(51) Int. Cl.
*B32B 27/08* (2006.01)
*B32B 7/12* (2006.01)
(Continued)

(52) U.S. Cl.
CPC ............. *B32B 27/08* (2013.01); *B32B 7/12* (2013.01); *B32B 27/32* (2013.01); *B32B 27/36* (2013.01);
(Continued)

(58) Field of Classification Search
CPC .......... B32B 27/08; B32B 7/12; B32B 27/36; B65D 75/367; H01L 21/67
(Continued)

(56) References Cited

U.S. PATENT DOCUMENTS

| | | | |
|---|---|---|---|
| 2014/0116921 A1 | 5/2014 | Sasaki et al. | |
| 2015/0158649 A1* | 6/2015 | Huang | H05K 13/0084 |
| | | | 428/354 |
| 2018/0364400 A1 | 12/2018 | Eguchi et al. | |

FOREIGN PATENT DOCUMENTS

| | | |
|---|---|---|
| EP | 2842740 A1 | 3/2015 |
| JP | 2002179183 A * | 6/2002 |

(Continued)

OTHER PUBLICATIONS

Dec. 22, 2020 International Search Report issued in International Patent Application No. PCT/JP2020/038305.

*Primary Examiner* — Rafael A Ortiz
(74) *Attorney, Agent, or Firm* — Oliff PLC

(57) ABSTRACT

A cover tape for packing an electronic component includes: a substrate layer; a heat sealing layer placed on one surface side of the substrate layer; and an intermediate layer placed between the substrate layer and the heat sealing layer, and a transmitted image definition based on JIS K 7374, with an optical comb width set to 0.5 mm, is 30% or more.

14 Claims, 4 Drawing Sheets

(51) Int. Cl.
*B32B 27/32* (2006.01)
*B32B 27/36* (2006.01)
*B65D 75/36* (2006.01)
*H01L 21/67* (2006.01)
*H01L 21/673* (2006.01)

(52) U.S. Cl.
CPC ........ *B65D 75/367* (2013.01); *B32B 2250/02* (2013.01); *B32B 2250/24* (2013.01); *B32B 2255/10* (2013.01); *B32B 2255/26* (2013.01); *B32B 2255/28* (2013.01); *B32B 2307/21* (2013.01); *B32B 2307/31* (2013.01); *B32B 2307/414* (2013.01); *B32B 2307/518* (2013.01); *B32B 2307/732* (2013.01); *B32B 2439/40* (2013.01); *H01L 21/67259* (2013.01); *H01L 21/67356* (2013.01)

(58) Field of Classification Search
USPC ........................................................ 206/714
See application file for complete search history.

(56) References Cited

FOREIGN PATENT DOCUMENTS

| | | | | |
|---|---|---|---|---|
| JP | 2006-206071 A | 8/2006 | | |
| JP | 2007-45513 A | 2/2007 | | |
| JP | 2007-77318 A | 3/2007 | | |
| JP | 2007077318 A * | 3/2007 | | |
| JP | 2008-7588 A | 1/2008 | | |
| JP | 4544563 B2 | 9/2010 | | |
| JP | 2016089056 A * | 5/2016 | ............ | B32B 27/30 |
| JP | 2016-172410 A | 9/2016 | | |
| WO | WO-2012169387 A1 * | 12/2012 | ............ | B32B 27/08 |
| WO | 2013/161411 A1 | 10/2013 | | |
| WO | 2016/024529 A1 | 2/2016 | | |
| WO | 2017/061493 A1 | 4/2017 | | |

* cited by examiner

COVER TAPE FOR PACKING ELECTRONIC COMPONENT, PACKAGE, AND PACKAGE SET

TECHNICAL FIELD

The present disclosure relates to a cover tape for packing an electronic component, and a package and a package set using the same.

BACKGROUND ART

Recently, electronic components such as IC, resistors, transistors, diodes, capacitors, and piezoelectric element resistors are packaged by a tape and mounted on a substrate. In packaging by a tape, after storing the electronic component in a carrier tape including a plurality of storage portions configured to store the electronic component, a carrier tape is heat sealed with a cover tape, to obtain a package for storing and transporting the electronic component. When mounting the electronic component, the cover tape is peeled off from the carrier tape, and the electronic component is automatically taken out and mounted on the substrate. Incidentally, the cover tape is also referred to as a top tape.

For the cover tape, transparency to the extent that the contents are visible, has been required. For example, Patent Document 1 proposes a transparent conductive heat sealing material having transparency enough to visually confirm the content.

CITATION LIST

Patent Document

Patent Document 1: Japanese Patent No. 4544563

SUMMARY OF DISCLOSURE

Technical Problem

Electronic components are becoming smaller and more difficult to confirm through the cover tape. Furthermore, in the mounting step of an electronic component such as IC, a mounting step is carried out by confirming the position, direction, and angle of the electronic component in the storage portion, by taking an image with a CCD (Charge Coupled Device) camera, for example, through the cover film and analyzing the image. However, the image of the electronic component taken with a CCD camera through the conventional cover tape is unsharp, so that there has been a problem that the position, direction, and angle of the electronic component may not be confirmed. Thus, associated with miniaturization of the electronic component and a demand for confirmation with a CCD camera, a further improvement of the visibility of the cover tape is required.

The present disclosure has been made in view of the above circumstances, and a main object thereof is to provide a cover tape with excellent visibility of an electronic component to the extent that an image of the electronic component, when taken with a CCD camera through the cover tape, has good definition.

Solution to Problem

An embodiment of the present disclosure provides a cover tape for packing an electronic component comprising: a substrate layer; a heat sealing layer placed on one surface side of the substrate layer; and an intermediate layer placed between the substrate layer and the heat sealing layer, and a transmitted image definition based on JIS K 7374, with an optical comb width set to 0.5 mm, is 30% or more.

An embodiment of the present disclosure provides a package comprising: a carrier tape including a plurality of storage portions configured to store an electronic component, an electronic component stored in the storage portion, and the cover tape for packing an electronic component described above, placed to cover the storage portion.

Further, an embodiment of the present disclosure provides a package set comprising: a carrier tape including a plurality of storage portions configured to store an electronic component, and the cover tape for packing an electronic component described above, used to cover the storage portion of the carrier tape.

Advantageous Effects of Disclosure

According to the cover tape for packing an electronic component in the present disclosure, the visibility of an electronic component is improved to the extent that an image of the electronic component, when taken with a CCD camera, has good definition. Therefore, by using the cover tape for packing an electronic component or the package in the present disclosure, the position, direction, and angle of the electronic component may be confirmed for sure so that the electronic component may be mounted with high precision in a short time.

DESCRIPTION OF EMBODIMENTS

Figure 1:
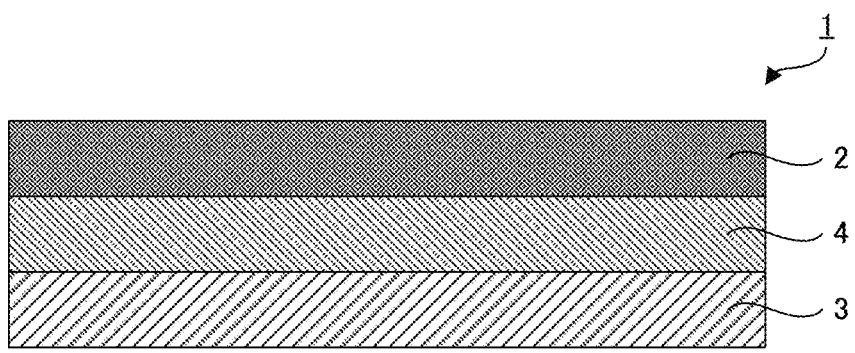
FIG. 1 is a schematic cross-sectional view illustrating an example of a cover tape for packing an electronic component in the present disclosure.

Embodiments of the present disclosure are hereinafter explained with reference to, for example, drawings. However, the present disclosure is enforceable in a variety of different forms, and thus should not be taken as is limited to the contents described in the embodiments exemplified as below. Also, the drawings may show the features of the present disclosure such as width, thickness, and shape of each part schematically comparing to the actual form in order to explain the present disclosure more clearly in some cases; however, it is merely an example, and thus does not limit the interpretation of the present disclosure. Also, in the present description and each drawing, for the factor same as that described in the figure already explained, the same reference sign is indicated and the detailed explanation thereof may be omitted.

In the present descriptions, in expressing an aspect wherein some member is placed on the other member, when described as merely "on" or "below", unless otherwise stated, it includes both of the following cases: a case wherein some member is placed directly on or directly below the other member so as to be in contact with the other member, and a case wherein some member is placed on the upper side or the lower side of the other member via yet another member. Also, in the present descriptions, on the occasion of expressing an aspect wherein some member is placed on the surface of the other member, when described as merely "on the surface side" or "on the surface", unless otherwise stated, it includes both of the following cases a case wherein some member is placed directly on or directly below the other member so as to be in contact with the other member, and a case wherein some member is placed on the upper side or the lower side of the other member via yet another member.

A cover tape for packing an electronic component and a package in the present disclosure are hereinafter described in detail.

A. Cover Tape for Packing an Electronic Component

The cover tape for packing an electronic component in the present disclosure comprises a substrate layer; a heat sealing layer placed on one surface side of the substrate layer; and an intermediate layer placed between the substrate layer and the heat sealing layer, and a transmitted image definition based on JIS K 7374, with an optical comb width set to 0.5 mm, is 30% or more.

Conventionally, when visually confirming the electronic component which is a storage object, as an index of visibility, haze value and total light transmittance of the cover tape for packing an electronic component (hereinafter, sometimes simply cover tape) has been used. However, as described above, because of a requirement of carrying out the mounting step while confirming the position, direction, and angle of the electronic component in the storage portion, in order to confirm the position, direction, and angle of the electronic component with a testing instrument such as a CCD camera, the reflected light amount that reaches from the electronic component so the CCD cameral, for example, needs to be stronger with respect to the light amount from surrounding.

The present inventors have found out that, when a cover tape merely having good haze value and total light transmittance is used, it may be difficult to analyze the position, direction, and angle of the electronic component, for example, from the image obtained with the CCD camera, for example.

Therefore, the present inventors have considered the use of transmitted image definition as an index of the visibility of the cover tape. Further, the present inventors have found out that the transmitted image definition with wide optical comb (such as 2.0 mm) of an image clarity measurement device is insufficient as an index of visibility; and the transmitted image definition with narrow optical comb width of 0.5 mm or less is effective as a reference of visibility of the electronic component through the cover tape. For the transmitted image definition with the optical comb width of the image clarity measurement device of 2.0 mm, since a preferable value is exhibited even when the diffusion angle of light transmitted through the cover tape for packing an electronic component is relatively wide, it is considered that the reflected light transmitted through the cover tape, from the electronic component, does not determine the light amount actually reaching the CCD camera, for example. Meanwhile, for the transmitted image definition with optical comb width of 0.5 mm, since the light amount of narrow light diffusion angle region will be evaluated, it is possible to determine the reflected light amount actually reaching the CCD camera, for example. Therefore, it is considered that it may be employed as an index whether an image has high definition or not, when taken with a CCD camera.

Also, when winding the cover tape in a reel shape, a change caused by the adhesion between the cover tapes, for example, may occur to the surface of the heat sealing layer (heat sealing surface), depending on the environment, for example, during transportation. Specifically, the surface property of the heat sealing surface will be changed so that unevenness in transparency as the cover tape may occur, which becomes a patchy pattern, and there is a case where a problem such as deterioration of visibility occurs. However, for the cover tape with high reflected light amount of the electronic component that has actually reached the CCD camera, for example, since the overall visibility of the cover film is high even when the surface of the heat sealing surface is changed, it is possible to lower the rate of variation of visibility by location so that the occurrence of defects may be suppressed.

The cover tape in the present disclosure will be explained with reference to drawings. FIG. 1 is a schematic cross-sectional view illustrating an example of a cover tape in the present disclosure. As shown in FIG. 1, cover tape 1 in the present disclosure comprises substrate layer 2; heat sealing layer 3 placed on one surface side of the substrate layer 2; and antistatic layer 4 placed between the substrate layer 2 and the heat sealing layer 3.

Figure 2A:
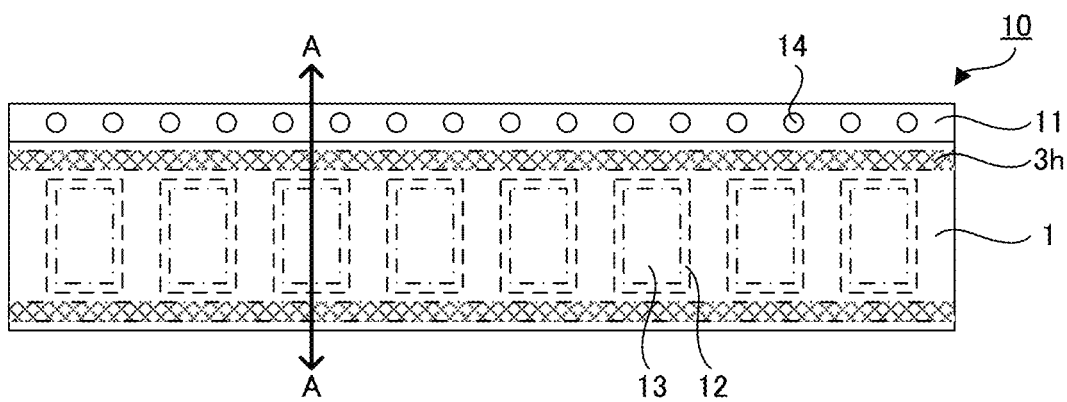
FIG. 2A is a schematic plan view and FIG. 2B is a schematic cross-sectional view illustrating an example of a package in the present disclosure.
Figure 2B:
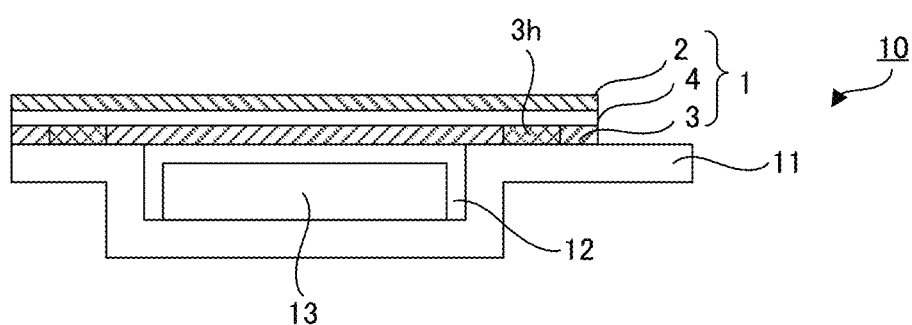

FIGS. 2A and 2B are a schematic plan view and a schematic cross-sectional view illustrating an example of a package using the cover tape for packing an electronic component in the present disclosure, and FIG. 2B is a cross-sectional view of A-A line in FIG. 2A. As shown in FIGS. 2A and 2B, package 10 comprises carrier tape 11 including a plurality of storage portions 12 configured to store electronic component 13; electronic component 13 stored in the storage portion 12; and cover tape 1 placed to cover the storage portion 12. The cover tape 1 is heat sealed onto the carrier tape 11, and heat sealing portions 3h are provided in the shape of lines with a predetermined width on both ends of the heat sealing layer 3 of the cover tape 1. Also, in the package 10, the carrier tape 11 may include feeding hole 14.

1. Transmitted Image Definition

The transmitted image definition is a value indicating the degree of the definition of the image of an object viewed through a plastic. The transmitted image definition of the cover tape in the present disclosure, measured using an optical comb with width of 0.5 mm based on JIS K 7374, is 30% or more, preferably 40% or more, and particularly preferably 50% of more.

If the cover tape has such a transmitted image definition, the reflected light amount from the electronic component is sufficient, the image taken by the camera, for example, through the cover film will be high in definition so that the position, direction, and angle of the stored electronic component may be confirmed. Also, since the cover tape in the present disclosure has better visibility due to the transmitted image definition than the conventional cover tape, even when the surface property of the heat sealing surface is changed due to winding, the subsequent deterioration of visibility is less likely to occur.

Also, the upper limit of the transmitted image definition measured using an optical comb having a width of 0.5 mm is not particularly limited, and is usually 70% or less.

Also, the cover tape in the present disclosure may also have a transmitted image definition based on JIS K 7374, with an optical comb width set to 0.25 mm of 20% or more, among the above, may be in a range of 30% to 70%.

Further, the transmitted image definition based on JIS K 7374, with an optical comb width set to 0.125 mm is preferably 10% or more, among the above, in a range of 20% to 60%.

The transmitted image definition (image clarity) is determined by measuring the light amount transmitted through a cover tape test piece by moving an optical comb through thereof. Specifically, after attaching the cover tape test piece to the sample mounting table, the received light waveform is measured by moving the optical comb, perpendicular to the ray axis of the transmitted light of the test piece, through thereof, and reading the maximum light amount when the transmission portion of the comb is on the ray axis (M), and the minimum light amount when the light shielding portion of the comb is on the ray axis (m). Then, from the maximum light amount (M) and the minimum light amount (m) of the obtained received light waveform, it is calculated by the following formula.

$$C(n)=\{(M-m)/(M+m)\}\times 100$$

Here, C(n) is the transmitted image definition (%) when the optical comb width is "n" (mm); "M" is the maximum light amount when the optical comb width is "n" (mm); and "m" is the minimum light amount when the optical comb width is "n" (mm).

The transmitted image definition may be measured by a transmission definition measuring device according to a transmission method of a transmitted image definition based on JIS K 7374. Examples of such a measuring device may include Image Clarity Meter ICM-1T from Suga Test Instruments Co., Ltd.

Incidentally, when extrusion-molding, for example is used for a method for producing a cover tape, the transmitted image definition may differ somewhat between the MD direction and the TD direction; and in the present disclosure, both the transmitted image definition in the MD direction and the TD direction fall within the above-mentioned range.

As described above, since the transmitted image definition measured with an optical comb width set to 0.5 mm or 0.25 mm, the cover tape in the present disclosure is superior to the conventional cover tape in the visibility of the electronic component stored therein; and in particular, the cover tape is superior in the visibility of the electronic component to the extent that an image of the electronic component, when taken with a testing instrument such as a CCD camera, for example, has good definition, and the position, direction, and angle of the electronic component may be confirmed. Therefore, in the package using the cover tape in the present disclosure, the position, direction, and angle of the electronic component may be recognized precisely using a CCD camera through the cover tape. Thus, according to the cover tape for packing an electronic component in the present disclosure, it is possible to take out the electronic component with high accuracy in a short time, so that the mounting efficiency may be improved.

Hereinafter, each configuration of the cover tape in the present disclosure will be described. The cover tape in the present disclosure may be constructed by selecting and combining a substrate layer, a heat sealing layer, and an intermediate layer, for example, such that the transmitted image definition, measured with an optical comb width set to 0.5 mm or 0.25 mm, falls within the above-described range of the value.

Specifically, as will be described later, by selecting the type of resin in the substrate layer, and adjusting the inorganic filler content and the antimony catalyst content included in the substrate layer, for example, the transmitted image definition may be improved. Also, the transmitted image definition may be improved by selecting the type of the conductive fine particle included in the heat sealing layer, and adjusting the dispersion condition of the conductive fine particle, for example. Further, the transmitted image definition may be improved by selecting a type of a resin or an additive in the intermediate layer, adjusting an additive content, and selecting a film forming method of the intermediate layer. Also, the transmitted image definition may also be improved by adjusting the thickness of each layer. Further, the transmitted image definition may be improved also by changing the coating method, and the drying method, for example, of the heat sealing layer.

In the present disclosure, by employing one or more of these means, the transmitted image definition, measured with an optical comb width set to 0.5 mm or 0.25, mm may be within the above-described range of the value.

2. Substrate Layer

The substrate layer in the present disclosure is a layer that supports the heat sealing layer and the intermediate layer to be described later.

The substrate layer is not particularly limited, and various materials may be applied as long as the transmitted image definition of the cover tape, measured with an optical comb width set to 0.5 mm or 0.25 mm, is the above-described value or more, and the material has, for example, mechanical strength to withstand external force during storage and transportation, and heat resistance to withstand manufacturing and packaging by a tape.

Examples thereof may include polyesters such as polyethylene terephthalate, polybutylene terephthalate, polyethylene naphthalate, polyethylene terephthalate-isophthalate copolymer, and terephthalic-cyclohexanedimethanol-ethylene glycol copolymer; polyamides such as nylon 6, nylon 66, and nylon 610; and polyolefins such as polyethylene, polypropylene, and polymethylpentene.

Among them, polyesters such as polyethylene terephthalate, polyethylene naphthalate, and polybutylene terephthalate are preferably used in the present disclosure for their preferable cost and mechanical strength. Among the above, polyethylene terephthalate is preferable for improving the transmitted image definition.

Also, for the polyester resin, a catalyst is usually used during synthesis. In the present disclosure, examples of such resin may include a resin wherein antimony or titanium is used as a catalyst, however, a polyester resin wherein antimony is not used as a catalyst is preferable to improve the transmitted image definition.

Also, the substrate layer may be subjected to an antistatic treatment. When it is subjected to the antistatic treatment, the cover tape may be prevented from being charged.

Specifically, examples thereof may include an embodiment wherein an antistatic treatment is carried out by kneading an antistatic material such as a surfactant into a resin to obtain a substrate layer including an antistatic material. Also, as an antistatic treatment, the antistatic layer may be provided on the outermost layer by using a surfactant, a silicon organic compound, a conductive carbon black, a conductive polymer, a metal vapor deposition, and conductive fine particles such as a metal oxide, for example, on the surface of substrate layer, which is a biaxially oriented film, on the opposite surface to the heat sealing layer, as required. By carrying out the antistatic treatment in this manner, adhesion of dust, and dirt, for example, to the surface of the substrate layer may be prevented, and occurrence of static electricity due to being in contact with the surface of another layer may be prevented.

Examples of the antistatic treatment method may include a method wherein a layer composed of the resin is coated with an antistatic layer including an antistatic material. As the antistatic material, for example, any one of magnesium silicate or smectite, montmorillonite, beidellite, nontronite, hectorite, and saponite, or a combination thereof is suitably used.

Examples of the antistatic layer may include those including at least the antistatic material and a thermoplastic resin. Examples of the thermoplastic resin may include any one of an acryl based resin, a polyester based resin, an acrylic modified polyester resin, a polyurethane based resin, a polyvinyl chloride based resin, an ethylene-vinyl acetate based resin, a butadiene based resin, and a styrene based resin, or a combination thereof.

Also, an additive such as an inorganic filler such as silica may be included in the substrate layer, if necessary, for example, to prevent wrinkles and blocking; however, the less the inorganic filler in the substrate layer, the better the transmitted image definition. Therefore, those not including these additives, particularly an inorganic filler, are preferable from the viewpoint of improving the transmitted image definition. Also, since the use of an antimony catalyst may lower the transmitted image definition, it is preferable to use a material synthesized without using an antimony catalyst, for the substrate layer.

In the present disclosure, it is preferable that the resin material a included in the substrate layer is a polyester with an antimony content of 50 ppm or less. Such a polyester may be obtained, for example, by synthesizing thereof using a titanium compound catalyst.

The substrate layer may be a single layer, and may be a stack of a plurality of layers of the same kind or different kinds. Also, the substrate layer may be an oriented film, and may be an unoriented film. Among the above, the substrate layer may be a uniaxially or biaxially oriented film for the purpose of improving strength.

The thickness of the substrate layer may be, for example, 2.5 μm or more and 300 μm or less, may be 6 μm or more and 100 μm or less, and may be 12 μm or more and 50 μm or less. When the thickness of the substrate layer is too thick, the heat sealing temperature at the time of packaging by a tape may be increased, which is disadvantageous in terms of cost. Also, when the thickness of the substrate layer is too thin, mechanical strength may be insufficient.

The substrate layer may be subjected to, for example, easy adhesion treatment such as corona discharge treatment, plasma treatment, ozone treatment, flame treatment, preheat treatment, dust removal treatment, vapor deposition treatment, alkali treatment, and sandblasting treatment.

3. Heat Sealing Layer

The heat sealing layer in the present disclosure is placed on the intermediate layer, on a surface opposite to the substrate layer. When the package is produced using the cover tape in the present disclosure, the cover tape and the carrier tape are adhered to each other by heat sealing the heat sealing layer to the carrier tape.

The heat sealing layer in the present disclosure is not particularly limited as long as the transmitted image definition of the cover tape, measured with an optical comb width set to 0.5 mm or 0.25 mm, may be the above-described value or more. As the heat sealable synthetic resin included in the heat sealing layer, specifically, any one of polyester resin, polyurethane resin, polyethylene based resin, polyolefin based resin such as polypropylene based resin, polyvinyl chloride based resin, polyvinyl acetate based resin, polybutadiene based resin, styrene based resin, and acryl based resin, or a combination thereof, is used. This is because it is most preferably used in terms of adhesion and strength, for example.

Also, it is preferable that the conductive fine particle is dispersed as the antistatic agent in the heat sealing layer. As the conductive fine particle used in the present disclosure, those having a 50% particle size of 0.40 μm or less, particularly 0.36 μm or less, and among them, 0.32 μm or less are preferable. This is because such a particle size is preferable from the viewpoint of ensuring transparency, since it is equal to or less than the short wavelength range of visible light.

The particle size may be measured with Nanotrac UPA-EX150 from Nikkiso Co., Ltd., using a dynamical light scattering method.

Here, the 50% particle size refers to a particle size wherein 50% of the particles are included in the particle size distribution.

The conductive fine particle having such a particle size may be a granular fine particle, and may be a needle-shaped fine particle; and it is preferable to be the needle-shaped fine particle in consideration of good conductivity and transparency when the same weight is added.

Here, the needle-shaped refers to a state wherein the ratio of the length in the longitudinal direction of the fine particle and the width of the fine particle is 5:1 or more.

The conductive fine particle is not particularly limited as long as it is a fine particle having conductivity; and examples thereof may include a metal fine particle such as gold, silver, nickel, aluminum, and copper; a carbon black fine particle; a conductive fine particle obtained by imparting conductivity to a metal oxide such as tin oxide, zinc oxide, and titanium oxide; a conductive fine particle obtained by imparting conductivity to barium sulfate; a conductive fine particle obtained by imparting conductivity to a sulfide such as zinc sulfide, copper sulfide, cadmium sulfide, nickel sulfide, and palladium sulfide.

Among the above, in the present disclosure, a conductive fine particle obtained by imparting conductivity to a metal oxide such as tin oxide, zinc oxide, and titanium oxide is suitably used; and a tin oxide fine powder is particularly preferable. The tin oxide may be or may not be doped, and antimony-doped is particularly preferable. The powder resistivity of such antimony-doped tin oxide is preferably 500 Ω·cm or less, most preferably 100 Ω·cm or less, from the viewpoint of ensuring conductivity.

The powder resistivity may be calculated by forming the conductive fine particle into a cylindrical shape under a pressure of 10 MPa, measuring the DC resistance thereof using Digital Multimeter 7551-01 from Yokogawa Test & Measurement Corporation, and using she measured value in the following formula.

Powder resistivity=measured value×cross-sectional area of the cylinder/thickness of the cylinder In the present disclosure, when the heat sealing layer includes the needle-shaped conductive fine particle, in particular, a fine powder of antimony-doped tin oxide, both of the improvement of the visibility of the cover tape and the securement of the conductivity may be possible at the same time.

The heat sealing layer in the present disclosure may be produced by mixing and dispersing the conductive fine particle with the heat sealable synthetic resin, and may be uniformly dispersed using various organic based dispersants, for example.

The mixing ratio of the synthetic resin and the conductive fine particle differs depending on the type, and particle size, for example, of the conductive fine particle; and the amount of the conductive fine particle is usually 10 to 1000 parts by weight, and preferably 100 to 800 parts by weight, with respect to 100 parts by weight of the synthetic resin. When the amount of the conductive fine particle is less than the above range, it is not preferable because the conductivity may be insufficient so that there may be a problem in the antistatic performance. Also, when the amount of the conductive fine particle is more than the above range, it is not preferably because various problems may occur; such as a problem in heat sealing property, and difficulty in dispersion into the synthetic resin.

The surface resistivity of such heat sealing layer in the present disclosure is preferably in a range of $10^4$ to $10^{12} \Omega$ per square, particularly preferably in a range of $10^5$ to $10^{12} \Omega$ per square, and most preferably in a range of $10^6$ to $10^{11} \Omega$ per square. When it is higher than the above range, there may be a problem in the antistatic performance, and when it is lower than the above range, such a high antistatic performance is not required, which may be a problem in terms of cost. Incidentally, when it becomes in contact with a charged object, a severe electrostatic discharge (ESD) may be caused.

The surface resistivity of the heat seal layer in the present disclosure is measured using a high resistivity meter (High Resistance Meter Hiresta-UP, from Mitsubishi Chemical Analytech Co., Ltd.).

The coating amount when using the heat sealing layer in the present disclosure varies according to the use application; and is generally in a range of 0.1 to 8 $g/m^2$. This is because, when it is less than the above range, a problem arises in terms of the bonding strength, and when the coating amount is more than the above range, not much effect may be obtained, resulting in a problem in terms of cost such as waste of material cost.

In the heat sealing layer, a surfactant, a conductive polymer, or an organosilicon compound may be used as an antistatic agent instead of the conductive fine particle. Examples of the surfactant may include cationic surfactants such as quaternary ammonium salts, pyridium salts, imidazolium salts, primary to tertiary amine salts, sulfonium salts, and phosphonium salts; anionic surfactants such as sulfonates, sulfate esters, and phosphate esters; amphoteric surfactants such as amino acids, and amino acid sulfate esters; nonionic surfactants such as amino alcohols, glycerines, and polyethylene glycols; and further, polymer surfactants wherein monomer components including the above surfactants are polymerized. Examples of the conductive polymer may include polyacetylene, polythiophene, polypyrrole, polyaniline, polyphenylene vinylene, polyacene, and derivatives thereof.

An additive such as a dispersant may be included in the heat sealing layer, as necessary. For example, when the heat sealing layer includes a heat sealable resin (thermoplastic resin) and a conductive fine particle (metal oxide), a dispersant may be used in order to uniformly and stably disperse the conductive fine particle.

However, if the selection of the dispersant is mistaken, the dispersion of the conductive fine particle may rather be less stabilized, and the coating agent may become uneven (gel); or the transparency (haze) of the coating film may be deteriorated. Therefore, it is important to obtain a stable dispersion state, regardless of the presence or absence of the use of a dispersant; and when such a coating agent is used, the transparency is improved. However, if the dispersion is excessively promoted, the transparency is improved, while the conductivity (surface resistivity) of the coating film is deteriorated. That is, the heat sealing layer is preferably a layer wherein the conductive fine particles are appropriately uniformly dispersed.

The thickness of the heat sealing layer may be, for example, 0.05 µm or more and 3.0 µm or less. When the thickness of the heat sealing layer is too thin, a uniform film may not be obtained. Also, when the thickness of the heat sealing layer is too thick, the transparency of the cover tape may be lowered.

Examples of a method for forming the heat sealing layer may include a method wherein a composition for a heat sealing layer including an ethylene-vinyl acetate copolymer, a polyethylene resin, and, if necessary, other resins and additives described above, for example, dispersed or dissolved in a solvent is used; the composition for a heat sealing layer is applied to on an intermediate layer, on a surface opposite to a substrate layer; and dried. Examples of a method for applying the composition for a heat sealing layer may include known coating methods such as roll coating, reverse roll coating, gravure coating, gravure reverse coating, comma coating, bar coating, wire bar coating, rod coating, kiss coating, knife coating, die coating, flow coating, dip coating, and spray coating.

Also, as the heat sealing layer, a film may be used. In this case, a method for stacking the substrate layer and the intermediate layer, and the heat sealing layer is not particularly limited, and a known method may be used. Examples thereof may include a method wherein a film manufactured in advance is adhered to an intermediate layer by an adhesive, and a method wherein a raw material of a film subjected to heat melting is extruded onto an intermediate layer by, for example, a T-die to obtain a stack. As the adhesive, for example, a polyester based adhesive, a polyurethane based adhesive, and an acryl based adhesive may be used.

4. Intermediate Layer

In the present disclosure, as shown in FIG. 1, intermediate layer 4 is placed between substrate layer 2 and heat sealing layer 3. With the intermediate layer, adhesion between the substrate layer and the heat sealing layer may be improved. Also, with the intermediate layer, cushioning property, when the cover tape in the present disclosure is heat sealed to the carrier tape, may be improved so that heat may be more uniformly applied to the heat sealing layer. Further, the transmitted image definition of the cover tape may be easily adjusted by the selection of the intermediate layer.

The intermediate layer is not particularly limited as long as the transmitted image definition of the cover tape, measured with an optical comb width set to 0.5 mm or 0.25 mm, is the above-described value or more. Examples thereof may include an intermediate layer including any one of a medium-density and low-density polyethylene, a linear polyethylene, a polyethylene vinyl acetate copolymer, an ethylene-methacrylic acid copolymer (EMAA), an ethylene-methyl methacrylate copolymer (EMMA), a polypropylene, an ionomer, a styrene-butadiene-styrene copolymer, and a styrene-ethylen-butylene-styrene block copolymer, or a mixture thereof, and the thickness thereof is approximately 10 to 100 µm. Also, such an intermediate layer may be formed by a dry lamination method or an extrusion lamination method.

However, in the present disclosure, among the above resins, low-density polyethylene, particularly linear low-density polyethylene (LLDPE, density: 0.910 to 0.925), is suitably used, since she transmitted image definition of the cover tape may be improved.

As the intermediate layer, a film is preferably used. By using a film as the intermediate layer, the transmitted image definition may be easily adjusted. Also, it is preferable that the intermediate layer is one wherein bleeding of an additive, such as an antiblocking agent and an antistatic agent, does not occur on its surface. Therefore, the intermediate layer is preferably one wherein an additive such as an antiblocking agent and an antistatic agent is included so as not to cause bleeding; or one not including such an additive. This because, in the intermediate layer including a large amount of the additive, unevenness is generated on the surface thereof due to the bleeding of the additive on the surface, so that the light diffusion angle of the cover tape is increased, resulting in a decrease in the transmitted image definition.

The particle size, particle size distribution, and added amount of the inorganic filler (such as antiblocking agent) added to the intermediate layer affect the transmitted image definition.

The film forming method of the intermediate layer also affects the transmitted image definition. When the cooling rate of the molten resin is low, crystallization of the resin proceeds, so that an intermediate layer having high haze and poor transmitted image definition may be obtained; whereas, when the cooling rate is high, the intermediate layer having low haze and good transmitted image definition may be obtained. The water-cooled inflation type and the T-die type provide a film with better transmitted image definition than the air-cooled inflation type.

The intermediate layer may be subjected to an easy adhesion treatment such as a corona-discharge treatment, a plasma treatment, an ozonation treatment, a flame treatment, a preheat treatment, a dust removal treatment, a vapor deposition treatment, an alkaline treatment, and a sandblasting treatment.

5. Adhesive Layer

Figure 3:
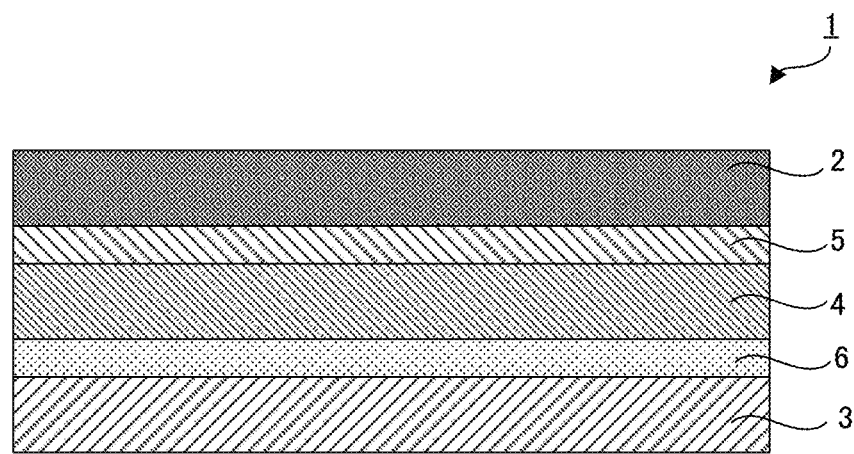
FIG. 3 is a schematic cross-sectional view illustrating an example of a cover tape for packing an electronic component in the present disclosure.

In the present disclosure, as shown in FIG. 3 for example, adhesive layer 5 may be included between substrate layer 2 and intermediate layer 4. By forming the adhesive layer on the substrate layer, adhesion between the substrate layer and the intermediate layer may be improved, even when the substrate layer has poor adhesive force. The adhesive layer may be appropriately selected according to the material used for the substrate layer and the intermediate layer, and is not particularly limited. For example, it may be formed of an adhesive such aa a low-density polyethylene, an ethylene-α-olefin copolymer having a density of 0.915 to 0.940 g/cm$^3$, a polyethylene vinyl acetate copolymer, an ionomer, a polypropylene, a polybutadiene, a polyurethane, a polyester or a polyolefin which is any one of modified product thereof, an isocyanate based, and an imine based; and the thickness is preferably approximately 0.2 to 60 μm. The adhesive layer may be formed by applying or extruding onto the substrate layer, and the intermediate layer may be dry-laminated or extrude-laminated on this adhesive layer. Incidentally, this layer is a layer formed as necessary, as described above.

6. Primer Layer

In the present disclosure, as shown in FIG. 3 for example, primer layer 6 may be provided between the heat sealing layer 3 and the intermediate layer 4. In particular, the layer may be preferably applied when it is required to suppress delamination between the intermediate layer 4 and the heat sealing layer 3; or when it is required to improve the adhesiveness between the intermediate layer 4 and the heat sealing layer 3.

Since delamination between the intermediate layer and the heat sealing layer is suppressed in the cover tape provided with the primer layer, the appearance, when the cover tape heat-sealed to the carrier tape is peeled off, may be improved. Also, the adhesiveness between the intermediate layer and the heat sealing layer may be improved, so that the adhesive strength of the cover tape may be adjusted to an appropriate strength or more. Also, when the cover tape is heat-sealed to the carrier tape, there is an effect that the impact of the heat-sealing conditions on delamination and adhesive force may be mitigated by providing such primer layer.

Such primer layer may be formed from olefins, modified olefins, urethanes, modified urethanes, hydrogenated SBS or mixtures thereof.

Among these, examples of a preferable resin composition for forming a primer layer may include a resin composition including 0 to 100% by weight of a styrene-ethylene-butylene-styrene copolymer (SEBS) and 100 to 0% by weight of an acid-modified styrene-ethylene-butylene-styrene copolymer. The styrene-ethylene-butylene-styrene copolymer and the acid-modified styrene-ethylene-butylene-styrene copolymer may be preferably used alone respectively; and by using them mixed in the above range, adhesion between the primer layer and the intermediate layer may be remarkably improved, as well as adhesion between the primer layer and the heat sealing layer may be improved. As the result, in the cover tape in the present disclosure, the intermediate layer and the heat sealing layer may be adhered with sufficient strength, via such a primer layer. Also, it is preferable that an acrylic rubber is added to this resin composition at a ratio of 60% by weight or less of the entire resin composition. By adding the acrylic rubber at a ratio of 60% by weight or less of the entire resin composition, the function of the primer layer may further be exhibited, and the adhesive property may further be improved.

Incidentally the styrene-ethylene-butylene-styrene copolymer is a hydrogenated styrene-butadiene-styrene copolymer, and the acid-modified styrene-ethylene-butylene-styrene copolymer is a styrene-ethylene-butylene-styrene copolymer wherein an acid modification ratio is 1 to 100%.

The acrylic rubber is a rubber including an alkyl acrylic acid ester as a main component. Here, examples of the acrylic acid ester may generally include ethyl acrylate, butyl acrylate, methoxyethyl acrylate, and acrylonitrile. Also, examples of the crosslinking functional group constituting the acrylic rubber may include 2-chloroethylvinyl ether, other active halogen-containing monomers (such as vinyl chloroacetate and allyl chloroacetate), epoxy group-including monomers (such as allyl glycidyl ether and glycidyl methacrylate), and ethylidene norbornene.

The coating amount of the primer layer is preferably in a range of 0.05 to 2.5 g/m$^2$, and particularly preferably in a range of 0.1 to 2.0 g/m$^2$. This is because, when the amount is less than the above range, the effect as a primer layer is not sufficient, and when the amount is more than the above range, the effect is not enhanced, which is a problem in terms of cost.

7. Others

In the cover tape in the present disclosure, the total light transmittance of the cover tape obtained by stacking each of the above-described layers is preferably 70% or more, particularly preferably 75% or more. Also, in the present disclosure, the haze value of the cover tape in the present disclosure is preferably 30% or less, particularly preferably 25% or less.

The haze values and total light transmittance are values measured in accordance with JIS K 7136 and JIS K 7361.

When the cover tape has such optical properties, it will be a cover tape with better visibility.

However, even when only the haze value and total light transmittance are used as indexes of visibility, since the intensity of the light diffusion is not considered as the transmitted image definition, a cover tape capable of obtaining excellent visibility required for a camera inspection with a CCD camera, for example, cannot be obtained.

B. Package

The package in the present disclosure comprises a carrier tape including plurality of storage portions configured to store an electronic component; an electronic component stored in she storage portion; and the above-described cover tape placed to cover the storage portion.

According to the package in the present disclosure, by including the cover tape described above, the visibility of the electronic component, when the stored electronic component is observed through the cover tape, is excellent; particularly, the visibility of an electronic component is improved to the extent that an image of the electronic component, when taken with a CCD camera, has good definition. Therefore, the position, direction, and angle of the electronic component may be confirmed for sure so that the electronic component may be mounted with high precision in a short time.

FIGS. 2A and 2B are a schematic plan view and a schematic cross-sectional view illustrating an example of a package in the present disclosure. Incidentally, FIGS. 2A and 2B are described in "A. Cover tape for packing electronic component" above; thus, the description herein is omitted.

Hereinafter, each configuration of the package in the present disclosure will be described.

1. Cover Tape

The cover tape in the present disclosure is described in "A. Cover tape for packing electronic component" above; thus, the description herein is omitted.

In the package in the present disclosure, the heat sealing layer of the cover tape and the carrier tape are adhered by the heat sealing portion. The heat sealing portion may be placed, for example, on a part of the area where the heat sealing layer of the cover tape is in contact with the carrier tape. That is, the heat sealing layer may include a heat sealing portion and a non-heat sealing portion. Thereby, the peeling property of the cover tape to the carrier tape may be improved.

2. Carrier Tape

The carrier tape in the present disclosure is a member including plurality of storage portions configured to store the electronic component.

Any carrier tape may be use as long as it includes a plurality of storage portions; for example, any one of an embossed carrier tape (also referred to as an embossed tape), a punched carrier tape (also referred to as a punched tape), and a pressed carrier tape (also referred to as a pressed tape) may be used. Among them, the embossed carrier tape is preferably used in terms of, for example, cost, formability, and dimensional accuracy.

Examples of the material of the carrier tape may include plastics such as polyvinyl chloride, polystyrene, polyester, polypropylene, polycarbonate, polyacrylonitrile, and ABS resin; and paper. Among the above, the carrier tape is preferably a resin carrier tape.

The thickness of the carrier tape is appropriately selected according to, for example, the material of the carrier tape and the thickness of the electronic component. For example, the thickness of the carrier tape may be 30 µm or more and 1100 µm or less. When the thickness of the carrier tape is too thick, the formability may be deteriorated, and when the thickness of the carrier tape is too thin, the strength may be insufficient.

The carrier tape includes a plurality of the storage portions. The storage portion is usually placed with a predetermined interval along the longitudinal direction of the carrier tape. The size, depth, and pitch of the storage portion, for example, are appropriately adjusted according to, for example, the size and thickness of the electronic component.

A common method for forming a carrier tape may be applied for a method for forming a carrier tape including the storage portions, and is appropriately selected according to, for example, the kind and material of the carrier tape. Examples thereof may include press forming, vacuum forming, pressure forming, punching processing, and compressive processing.

3. Electronic Component

The electronic component used for the package in the present disclosure is not particularly limited. Examples thereof may include IC, resistor, capacitor, inductor, transistor, diode, LED (light emitting diode), liquid crystal, piezoelectric element register, filter, crystal oscillator, crystal resonator, connector, switch, potentiometer, and relay. The form of IC is also not particularly limited.

Recently, in smartphones and wearable devices, a large number of very small sized electronic components such as 0.1 mm to 1 mm×0.1 mm to 1 mm (such as 0.6 mm×0.3 mm, 0.4 mm×0.2 mm, 0.2 mm×0.1 mm) are used. In order to accurately mount a component having such a very small size, the component is required to be taken out accurately from the carrier tape. In the present disclosure, even when the electronic component stored in the storage portion is a very small-sized component as described above, since the image of the electronic component may be captured clearly with a CCD camera, for example, the electronic component may be taken out accurately, and the mounting efficiency may be improved.

4. Package

The package in the present disclosure is used for storing and transporting the electronic component. The electronic component is stored and transported in a state of a package, and subjected to mounting. When mounting, the cover tape is peeled off, and the electronic component stored in the storage portion of the carrier tape is taken out and mounted on, for example, a substrate.

C. Package Set

The package set in the present disclosure comprises: a carrier tape including a plurality of storage portions configured to store an electronic component, and the cover tape for packing an electronic component described above used to cover the storage portion of the carrier tape.

The carrier tape used for the package set in the present disclosure is similar to those described in "B. Package, 2. Carrier tape" above; thus, the description herein is omitted.

Also, the cover tape for packing an electronic component used for the package set in the present disclosure is similar to those described in "A. Cover tape for packing an electronic component" above; thus, the description herein is omitted.

Incidentally, the present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

The present disclosure is hereinafter explained in further details with reference to Examples and Comparative Examples.

Example 1

A mixture of 65 parts by weight of a silicate based antistatic agent (trade name "Laponite S482", from BYK Japan Co., Ltd.) with respect to 35 parts by weight of a solid content of a thermoplastic resin including a partially acrylic modified polyester based resin, was prepared as an antistatic agent. An antistatic layer was formed by coating one surface side of a biaxially oriented polyethylene terephthalate (PET) film (substrate layer A) having a thickness of 12 μm with the antistatic agent so as the coated amount was 0.07 g/m$^2$.

Then, the surface side of the substrate layer A, opposite to the surface wherein the antistatic layer was formed, was coated with a two-liquid curable type adhesive including a polyol component and an isocyanate component so as the coated amount was 4.2 g/m$^2$ (adhesive layer), further, a linear low-density polyethylene (LLDPE) film having a thickness of 30 μm (trade name "TUX-TCS-NP" from Tohcello, Inc) was stacked on the surface of the adhesive layer, as intermediate layer A.

Then, a primer layer was formed on the surface of the intermediate layer A by applying a mixture of a styrene-ethylene-butylene-styrene copolymer (SEBS) and an acid-modified styrene-ethylene-butylene-styrene copolymer, as a primer by a gravure direct method so as the coated amount was 1.2 g/m$^2$.

Next, 214 parts by weight of the solid content of an antimony-doped needle-shaped conductive tin oxide fine powder was mixed with 100 parts by weight of the solid content of the heat sealing agent including the styrene-methylmethacrylate copolymer, and the surfaces of the primer layer was coated with the mixture, as a transparent conductive heat sealing material so as the coated amount was 0.8 g/m$^2$ (heat sealing layer A). Thereby, cover tape 1 having a configuration including the antistatic layer/the substrate layer A/the adhesive layer/the intermediate layer A/the primer layer/the heat sealing layer A was produced.

Example 2

Cover tape 2 having a configuration including the antistatic layer/the substrate layer A/the adhesive layer/the intermediate layer B/the primer layer/the heat sealing layer A was produced in the same manner as Example 1, except that the intermediate layer A in Example 1 was changed to a linear low-density polyethylene (LLDPE) film having a thickness of 30 μm (trade name "TUX-VCS" from Tohcello, Inc.) as intermediate layer B.

Example 3

Cover tape 3 having a configuration including the antistatic layer/the substrate layer B/the adhesive layer/the intermediate layer B/the primer layer/the heat sealing layer A was produced in the same manner as in Example 1, except that the PET film as the substrate layer A in Example 1 was changed to a biaxially oriented polybutylene terephthalate (PBT) film (substrate layer B) having a thickness of 15 μm, and that the intermediate layer A in Example 1 was changed to intermediate layer B.

Example 4

Cover tape 4 having a configuration including the antistatic layer/the substrate layer C/the adhesive layer/the intermediate layer B/the primer layer/the heat sealing layer A was produced in the same manner as in Example 1, except that the PET film as the substrate layer A in Example 1 was changed to a biaxially oriented film (trade name "HNC" from Teijin Limited) of polyethylene terephthalate (PET) film synthesized with a non-antimony based catalyst, having a thickness of 12 μm (substrate layer C), and that the intermediate layer A in Example 1 was changed to the intermediate layer B.

Example 5

Cover tape 5 having a configuration including the antistatic layer; the substrate layer A/the adhesive layer/the intermediate layer B/the primer layer/the heat sealing layer B was produced in the same manner as in Example 1, except that the intermediate layer A in Example 1 was changed to the intermediate layer B, and that the heat sealing layer A was changed to the following heat sealing layer B. The heat sealing layer B was formed by mixing 140 parts by weight of the solid content of an antimony-doped sphere-shaped conductive tin oxide fine powder, including barium sulfate as a core material, and 100 parts by weight of the solid content of the heat sealing agent including a methylmethacrylate-butylmethacrylate copolymer, and the surfaces of the primer layer was coated with the mixture as a transparent conductive heat sealing material so as the coated amount was 1.6 g/m$^2$.

Comparative Example 1

Cover tape 6 having a configuration including the antistatic layer/the substrate layer A/the adhesive layer/the intermediate layer C/the primer layer/the heat sealing layer A was produced in the same manner as in Example 1, except that the intermediate layer A in Example 1 was changed to a linear low-density polyethylene (LLDPE) film having a thickness of 30 μm (trade name "LL-XUMNV" from Futamura Chemical Co., LTD.) as intermediate layer C.

Comparative Example 2

Cover tape 7 having a configuration including the antistatic layer/the substrate layer B/the adhesive layer/the intermediate layer C/the primer layer/the heat sealing layer A was produced in the same manner as in Example 1, except that the substrate layer A in Example 1 was changed to the substrate layer B, and that the intermediate layer A in Example 1 was changed to the intermediate layer C.

Comparative Example 3

Cover tape 8 having a configuration including the antistatic layer/the substrate layer C/the adhesive layer/the intermediate layer C/the primer layer/the heat sealing layer A was produced in the same manner as in Example 1, except that the substrate layer A in Example 1 was changed to the substrate layer C, and that the intermediate layer A in Example 1 was changed to the intermediate layer C.

[Transmitted Image Definition Measurement of Cover Tape]

The transmitted image definition of the cover tapes 1 to 8 obtained above was measured based on JIS K 7374. That is, a test piece was taken out from the cover tape, and the transmitted image definition of the test piece was measured with an optical comb width set to 0.125 mm, 0.25 mm, 0.5 mm, 1 mm, and 2 mm. As the measuring device, Image Clarity Meter ICM-1T from Suga Test Instruments Co., Ltd. was used. The light for the measurement was irradiated so as to enter from the surface of the substrate layer side of the cover tape and emit from the surface of the heat sealing layer side. The results are shown in Table 1.

[Total Light Transmittance and Haze Value Measurements]

The total light transmittance and the haze value of the cover tapes 1 to 8 obtained above were measured with a hazes guard II from Toyo Seiki Seisaku-sho, Ltd. The results are shown in Table 2.

[Evaluation of Visibility of Camera]

The visibility of a camera was measured by stacking the cover tape on open characters with black background (babibubebopapipupepo) having a size of 1.0 pt (=1/72 inch nearly equals to 0.35 mm), so that the substrate layer side of the cover tape faces the camera side; and observing and photographing an image with a digital microscope VH-720 from KEYENCE Corporation at magnification of 100 times. By visually observing the photographed image with the naked eye, and when the reading of the characters was easy, it was evaluated as the visibility of the camera was good, and when the reading of the characters was not easy, it was evaluated as the visibility of the camera was not good. The results are shown in Table 2.

On the other hand, when the optical comb width was as large as 2 mm, it was found out that a large difference did not occur in the transmitted image definition, which was not sufficient as an index of visibility.

Also, from the results shown in Table 2, there was no significant difference in the measurement results of the total light transmittance and the haze value of the cover tapes 1 to 4 and 6 to 8. The cover tape 5 exhibited no significant difference in the transmitted image definition, despite the high haze value measurement result, compared to cover tapes 1 to 4. It was also found out that the measurement results of the total light transmittance and the haze value were not sufficient as indexes of visibility.

Figure 4A:
FIGS. 4A and 4B are surface observation images of cover tape 2 and cover tape 4 in Examples.

Also, since a large difference has occurred in the transmitted image definition in Example 1 (cover tape 1), Example 2 (cover tape 2) and Comparative Example 1 (cover tape 6), it was found out that the transmitted image definition has changed depending on the type of the intermediate layer. Here, images of the surface of the cover tape 2 and the cover tape 4, taken with Digital Microscope VH-Z20 from KEYENCE Corporation, are respectively shown in FIGS. 4A and 4B. Further, FIGS. 5A and 5B show the results of similarly observed surfaces of the intermediate layer film B and the intermediate layer film C.

Figure 4B:
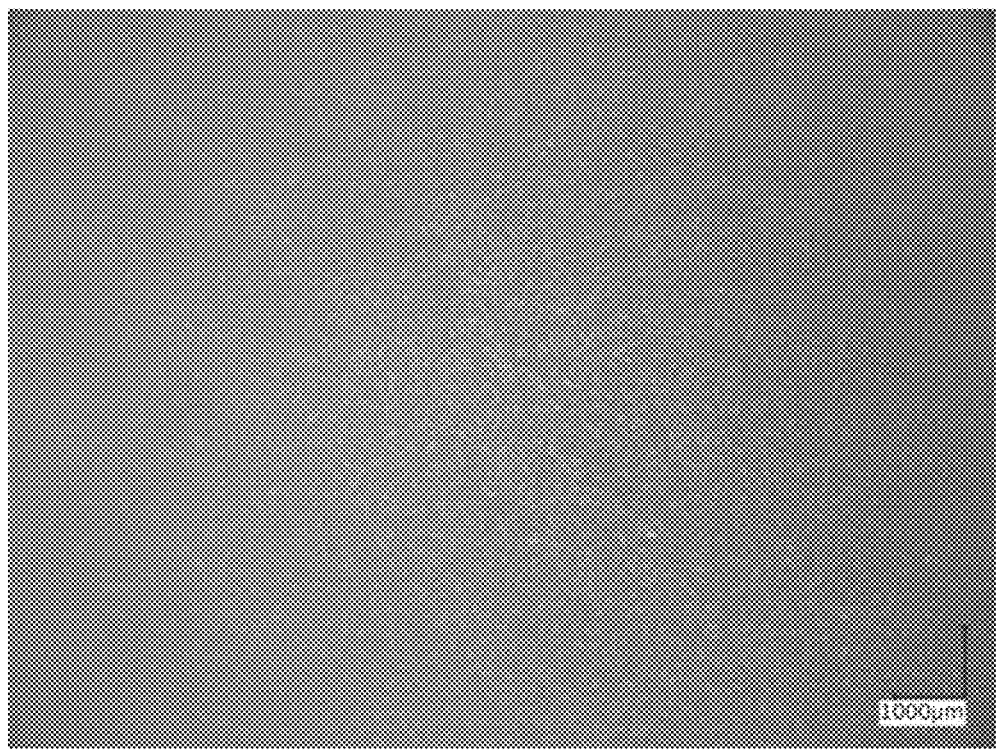
Figure 5A:
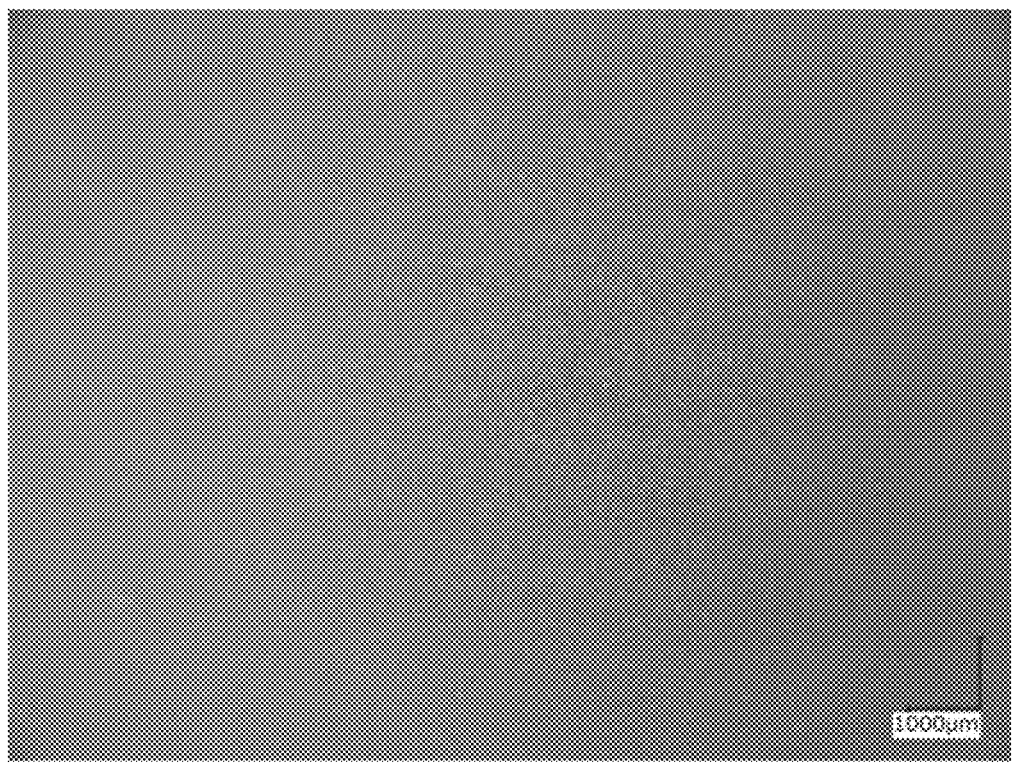
FIGS. 5A and 5B are surface observation images of intermediate layer film B and intermediate layer film C in Examples.
Figure 5B:

From FIG. 4B, a large number of white turbidity spots were confirmed on the surface of the cover tape 4, and as the result, it is considered that the degradation of the transmitted image definition has occurred. Also, since the white turbidity point, generated on the surface of the intermediate layer film C shown in FIG. 5B, is almost not generated on the surface of the intermediate layer film B shown in FIG. 5A, it was found out that the transmitted image definition may be changed depending on the type of the intermediate layer.

Also, since a difference has occurred in the transmitted image definition in Example 2 (cover tape 2) and Example

TABLE 1

| | | Transmitted image definition in MD (flow direction) Slit width | | | | | Transmitted image definition in TD (orthogonal direction) Slit width | | | | |
|---|---|---|---|---|---|---|---|---|---|---|---|
| | | 0.125 | 0.25 | 0.5 | 1 | 2 | 0.125 | 0.25 | 0.5 | 1 | 2 |
| | Blank | 97.6 | 97.9 | 98.1 | 98.2 | 98.5 | 97.6 | 97.9 | 98.1 | 98.2 | 98.5 |
| Example 1 | Cover tape 1 | 13.6 | 20.2 | 37.7 | 67.4 | 84.8 | 21.1 | 26.8 | 43.6 | 70 | 85.6 |
| Example 2 | Cover tape 2 | 16.3 | 25.8 | 49.6 | 76.1 | 89.3 | 26.5 | 35.6 | 55.1 | 77.2 | 89 |
| Example 3 | Cover tape 3 | 11.8 | 19 | 40.7 | 70.8 | 86.9 | 17.2 | 24.3 | 45.1 | 72.5 | 87.5 |
| Example 4 | Cover tape 4 | 23.3 | 29.6 | 50.3 | 72.9 | 86.9 | 32.4 | 37.7 | 52.3 | 72.1 | 85.9 |
| Example 5 | Cover tape 3 | 8.1 | 15.0 | 40.2 | 73.3 | 89.5 | 18.8 | 27.7 | 48.1 | 76.5 | 90.0 |
| Comp. Ex. 1 | Cover tape 6 | 1.5 | 3.4 | 15.6 | 51.5 | 83.8 | 2.3 | 5 | 18.3 | 53.7 | 83.7 |
| Comp. Ex. 2 | Cover tape 7 | 1.3 | 1.7 | 9.9 | 44.2 | 81.3 | 0.8 | 2.6 | 11.4 | 45.5 | 81.5 |
| Comp. Ex. 3 | Cover tape 8 | 3.4 | 7.0 | 24.1 | 58.8 | 85.2 | 4.9 | 10.3 | 27.7 | 60.7 | 84.9 |

TABLE 2

| | | Total light transmittance (%) | Haze value (%) | Visibility of camera |
|---|---|---|---|---|
| Example 1 | Cover tape 1 | 89.0 | 6.9 | Good |
| Example 2 | Cover tape 2 | 89.3 | 5.3 | Good |
| Example 3 | Cover tape 3 | 89.6 | 6.0 | Good |
| Example 4 | Cover tape 4 | 89.5 | 5.5 | Good |
| Example 5 | Cover tape 5 | 89.0 | 12.3 | Good |
| Comp. Ex. 1 | Cover tape 6 | 86.9 | 7.4 | Not good |
| Comp. Ex. 2 | Cover tape 7 | 89.3 | 7.5 | Not good |
| Comp. Ex. 3 | Cover tape 8 | 89.4 | 6.8 | Not good |

From the results shown in Table 1, it was found out that, when the optical comb width was set to 0.5 mm or less, there was a large difference in the transmitted image definition of the cover tape, which was sufficient as an index of visibility.

3 (cover tape 3), it was found out that the transmitted image definition was also changed depending on the type of the substrate layer. Further, since there was a difference in the transmitted image definition in Example 2 (cover tape 2) and Example 5 (cover tape 5), it was found out that the transmitted image definition was also changed depending on the type of the heat sealing layer.

REFERENCE SIGNS LIST

1: cover tape
2: substrate layer
3: heat sealing layer
4: intermediate layer
5: adhesive layer
6: primer layer 10: package
11: carrier tape
12: storage portion
13: electronic component

The invention claimed is:

1. A cover tape for packing an electronic component comprising:
   a substrate layer;
   a heat sealing layer placed on one surface side of the substrate layer; and
   an intermediate layer placed between the substrate layer and the heat sealing layer, and
   a transmitted image definition based on JIS K 7374, with an optical comb width set to 0.5 mm, is 30% or more.

2. The cover tape for packing an electronic component according to claim 1, wherein the heat sealing layer includes a needle-shaped conductive fine particle, and the conductive fine particle is a tine oxide fine powder.

3. The cover tape for packing an electronic component according to claim 1, wherein a resin material included in the substrate layer is polyester with an antimony content of 50 ppm or less.

4. The cover tape for packing an electronic component according to claim 1, wherein the substrate layer includes an antistatic agent.

5. The cover tape for packing an electronic component according to claim 1, wherein an antistatic layer including an antistatic agent is placed on the substrate layer, on a surface opposite to the heat sealing layer.

6. A cover tape for packing an electronic component comprising:
   a substrate layer,
   a heat sealing layer placed on one surface side of the substrate layer, and
   an intermediate layer placed between the substrate layer and the heat sealing layer, and
   a transmitted image definition based on JIS K 7374, with an optical comb width set to 0.25 mm, is 20% or more.

7. The cover tape for packing an electronic component according to claim 6, wherein the heat sealing layer includes a needle-shaped conductive fine particle, and the conductive fine particle is a tine oxide fine powder.

8. The cover tape for packing an electronic component according to claim 6, wherein a resin material included in the substrate layer is polyester with an antimony content of 50 ppm or less.

9. The cover tape for packing an electronic component according to claim 6, wherein the substrate layer includes an antistatic agent.

10. The cover tape for packing an electronic component according to claim 6, wherein an antistatic layer including an antistatic agent is placed on the substrate layer, on a surface opposite to the heat sealing layer.

11. A package comprising:
    a carrier tape including a plurality of storage portions configured to store an electronic component,
    an electronic component stored in the storage portion, and
    the cover tape for packing an electronic component according to claim 9 placed to cover the storage portion.

12. A package set comprising:
    a carrier tape including a plurality of storage portions configured to store an electronic component, and
    the cover tape for packing an electronic component according to claim 9 used to cover the storage portion of the carrier tape.

13. A package comprising:
    a carrier tape including a plurality of storage portions configured to store an electronic component,
    an electronic component stored in the storage portion, and
    the cover tape for packing an electronic component according to claim 10 placed to cover the storage portion.

14. A package set comprising:
    a carrier tape including a plurality of storage portions configured to store an electronic component, and
    the cover tape for packing an electronic component according to claim 10 used to cover the storage portion of the carrier tape.

* * * * *